(12) United States Patent
Akaogi et al.

(10) Patent No.: US 10,297,607 B2
(45) Date of Patent: May 21, 2019

(54) NON-VOLATILE MEMORY HAVING DISCRETE ISOLATION STRUCTURE AND SONOS MEMORY CELL, METHOD OF OPERATING THE SAME, AND METHOD OF MANUFACTURING THE SAME

(75) Inventors: Takao Akaogi, Cupertino, CA (US); Yider Wu, Chu-Pei (TW); Yi-Hsiu Chen, Chu-Pei (TW)

(73) Assignee: ELITE SEMICONDUCTOR MEMORY TECHNOLOGY INC. (TW)

( * ) Notice: Subject to any disclaimer, the term of this patent is extended or adjusted under 35 U.S.C. 154(b) by 788 days.

(21) Appl. No.: 13/615,723

(22) Filed: Sep. 14, 2012

(65) Prior Publication Data
US 2014/0078832 A1    Mar. 20, 2014

(51) Int. Cl.
*H01L 27/11565* (2017.01)
*H01L 21/762* (2006.01)
*H01L 27/11568* (2017.01)
*H01L 21/8234* (2006.01)

(52) U.S. Cl.
CPC .. *H01L 27/11565* (2013.01); *H01L 21/76229* (2013.01); *H01L 21/823425* (2013.01); *H01L 21/823481* (2013.01); *H01L 27/11568* (2013.01)

(58) Field of Classification Search
CPC ......... H01L 27/11565; H01L 27/11568; H01L 27/11563; H01L 21/76229; H01L 21/823425; H01L 21/823481; H01L 27/1052; H01L 27/108–27/11597; G11C 16/0475
See application file for complete search history.

(56) References Cited

U.S. PATENT DOCUMENTS

| | | | |
|---|---|---|---|
| 7,704,865 B2* | 4/2010 | Shih | H01L 21/2652 257/324 |
| 2003/0193827 A1* | 10/2003 | Choi | G11C 16/0475 365/185.18 |
| 2005/0227426 A1* | 10/2005 | Deppe et al. | 438/201 |
| 2009/0302472 A1* | 12/2009 | Yoon | H01L 27/11519 257/751 |
| 2010/0140678 A1* | 6/2010 | Shim | H01L 27/0207 257/314 |

* cited by examiner

*Primary Examiner* — Lauren R Bell
(74) *Attorney, Agent, or Firm* — Schmeiser, Olsen & Watts, LLP (57) ABSTRACT

A non-volatile memory having discrete isolation structures and SONOS (Silicon Oxide Nitride Oxide Silicon) memory cells, a method of operating the same, and a method of manufacturing the same are introduced. Every isolation structure on a semiconductor substrate having an array region has a plurality of gaps so as to form discrete isolation structures and thereby implant source lines in the gaps of the semiconductor substrate. Since the source lines are not severed by the isolation structures, the required quantity of barrier pins not connected to the source line is greatly reduced, thereby reducing the space required for the barrier pins in the non-volatile memory.

7 Claims, 8 Drawing Sheets

FIG. 1

(prior art)

NON-VOLATILE MEMORY HAVING DISCRETE ISOLATION STRUCTURE AND SONOS MEMORY CELL, METHOD OF OPERATING THE SAME, AND METHOD OF MANUFACTURING THE SAME

FIELD OF TECHNOLOGY

The present invention relates to non-volatile memories, and more particularly, to a non-volatile memory having discrete isolation structures and SONOS memory cells, a method of operating the same, and a method of manufacturing the same.

BACKGROUND

Due to the advancement of semiconductor integrated circuit manufacturing technology, not only is the quantity of the memory cells contained in a non-volatile memory ever-increasing, but the dimensions of constituent elements are also becoming smaller because of increasingly high integration.

To ensure the stability of memory cells in operation and bring memory performance into full play, it is necessary that the memory cells in a non-volatile memory have to be appropriately insulated or isolated from each other, regardless of the extent of the scaling-down of the dimensions of the constituent elements.

Figure 1:
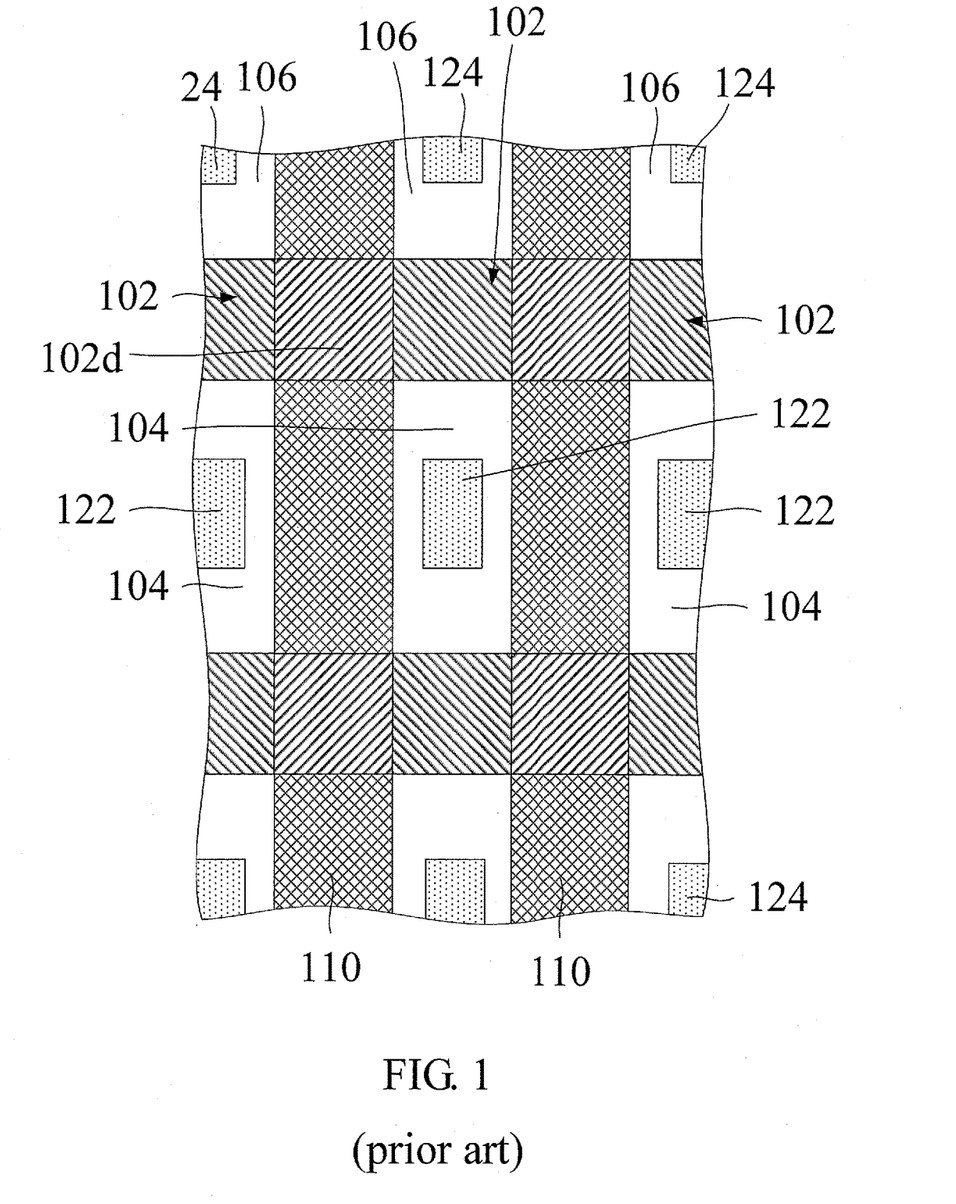
FIG. 1 is a top view of a conventional non-volatile memory array.

Referring to FIG. 1, there is shown a top view of a conventional non-volatile memory array. FIG. 1 shows the non-volatile memory array in part, wherein the memory array comprises a plurality of gate structures 102 functioning as SONOS memory cells. The gate structures 102 are connected by the controlling gates 102d to form word lines arranged transversely. Each said gate structure 102 is adjacent to a drain region 106 and a source region 104 which are parallel to the word lines. Referring to FIG. 1, a source line contact window 122 is disposed on the source region 104 between two neighboring word lines. The source line contact windows 122 are each filled with barrier pins and connected together above by means of a source line (not shown), such that the source regions 104 separated by isolation structures 110 are electrically connected to form source lines. A bit line contact window 124 is disposed on the drain region 106. The bit line contact windows 124 are each filled with barrier pins and connected together above by means of a bit line (not shown), such that the drain regions 106 separated by the isolation structures 110 are connected above to form bit lines.

However, due to the presence of the contact windows 122, 124 and the barrier pins, dimension scaling down is achieved at the cost of a difficult process and deterioration of product yield.

SUMMARY

It is an objective of the present invention to streamline the spatial arrangement within a non-volatile memory and thereby facilitate memory scaledown.

In order to achieve the above and other objectives, the present invention provides a non-volatile memory having discrete isolation structures and SONOS memory cells, comprising: a semiconductor substrate having an array region comprising a plurality of isolation structures, the isolation structures being parallel and each having a plurality of gaps for severing the isolation structure, wherein channels exposed from the semiconductor substrate are formed in the gaps, respectively, and extended in a direction perpendicular to the isolation structures; a plurality of source lines being perpendicular to a direction of aligning the isolation structures, positioned in the channels of the semiconductor substrate; a plurality of SONOS memory cells disposed on the semiconductor substrate between two neighboring isolation structures; and a plurality of drain regions disposed in the semiconductor substrate between two neighboring isolation structures, wherein the drain region of each SONOS memory cell and the source lines connected thereto are disposed in different sides of word lines parallel to the sources lines of the semiconductor substrate.

In an embodiment, the isolation structures are shallow trench isolation (STI) structures.

In an embodiment, in the semiconductor substrate, after crossing two discrete isolation structures consecutively, the source line is connected to a source line contact window.

In an embodiment, in the semiconductor substrate, after crossing 64 discrete isolation structures consecutively, the source line is connected to a source line contact window. Furthermore, the isolation structures and regions located within the semiconductor substrate and between two neighboring isolation structures each have a width of 0.16 μm when viewed in a direction parallel to word lines. Furthermore, both a width of each of the source lines in a direction perpendicular to the word lines and a distance between each of the source lines and the neighboring word line on the semiconductor substrate equal 0.1 μm.

In an embodiment, the source lines are made of cobalt silicide, nickel silicide, or titanium silicide.

In an embodiment, in the semiconductor substrate, one isolation structure which is not severed and therefore is intact alternates with two neighboring discrete isolation structures, whereas a source line contact window is positioned at a junction of a source line and the drain region lying between two neighboring severed isolation structures. Furthermore, the isolation structure having the source line contact window and flanked by two isolation structures parallel thereto and the two flanking isolation structures are discrete and collectively form a large isolation structure region.

The present invention further provides a method of operating the non-volatile memory. The method comprises the steps of: (a programming step): applying a positive voltage to one of a gate, source regions, and drain regions of SONOS memory cells to be programmed; (an erasing step): applying a positive voltage to one of source regions and drain regions of the SONOS memory cells to be erased and applying a negative voltage to the gate of the SONOS memory cells to be erased; and (a reading step): applying a positive voltage to one of the gate, the drain regions and source regions of the SONOS memory cells to be read, wherein the voltage applied in the reading step is lower than the voltage applied in the programming step.

In order to achieve the above and other objectives, the present invention provides a method of manufacturing a non-volatile memory having discrete isolation structures and SONOS memory cells, the method comprising the steps of: forming a plurality of discrete isolation structures in a semiconductor substrate, wherein each said isolation structure having a plurality of gaps for severing the isolation structure, wherein channels exposed from the semiconductor substrate are formed in the gaps, respectively, and extended in a direction perpendicular to the isolation structures; performing a source ion implantation process to form a plurality of source lines in the channels of the semiconductor substrate; forming ONO structures on the semiconductor substrate; depositing controlling gates and patterning the controlling gates to form a plurality of word lines; and forming a source line contact window.

Accordingly, the present invention is characterized in that, due to a special arrangement in forming isolated structures, the isolation structures are not formed beforehand in the semiconductor substrate's channels to be passed through by a source line, such that a non-volatile memory of the present invention dispenses with a conventional need of using plenty of source line contact windows to electrically connect source regions, which are otherwise separated by the isolation structures, to form source lines.

In another aspect, although the removal of the isolation structures will not be performed unless and until a subsequent process begins, formation of discrete isolation structures in advance dispense with a need of performing a removal step in a subsequent process to remove the isolation structures positioned on the source line regions. If, in the aforesaid isolation structure removal step, the removal is incomplete, any isolation structure which is not removed completely will hinder the formation of an implantation region to thereby increase the resistance of the source regions, thereby causing the active region in its entirely to fail.

Accordingly, the discrete isolation structures of the present invention not only streamlines and simplifies a process but also prevents a memory cell failure which might otherwise occur due to incomplete removal of isolation structures.

BRIEF DESCRIPTION OF THE DRAWINGS

Objectives, features, and advantages of the present invention are hereunder illustrated with specific embodiments in conjunction with the accompanying drawings, in which.

DETAILED DESCRIPTION

It is an objective of the present invention to separate isolation structures formed on a semiconductor substrate, such that gaps for separating the isolation structures form a continuous source region in a direction perpendicular to the isolation structures, thereby dispensing with the hassles of providing a source line contact window required for each gate structure.

Figure 2:
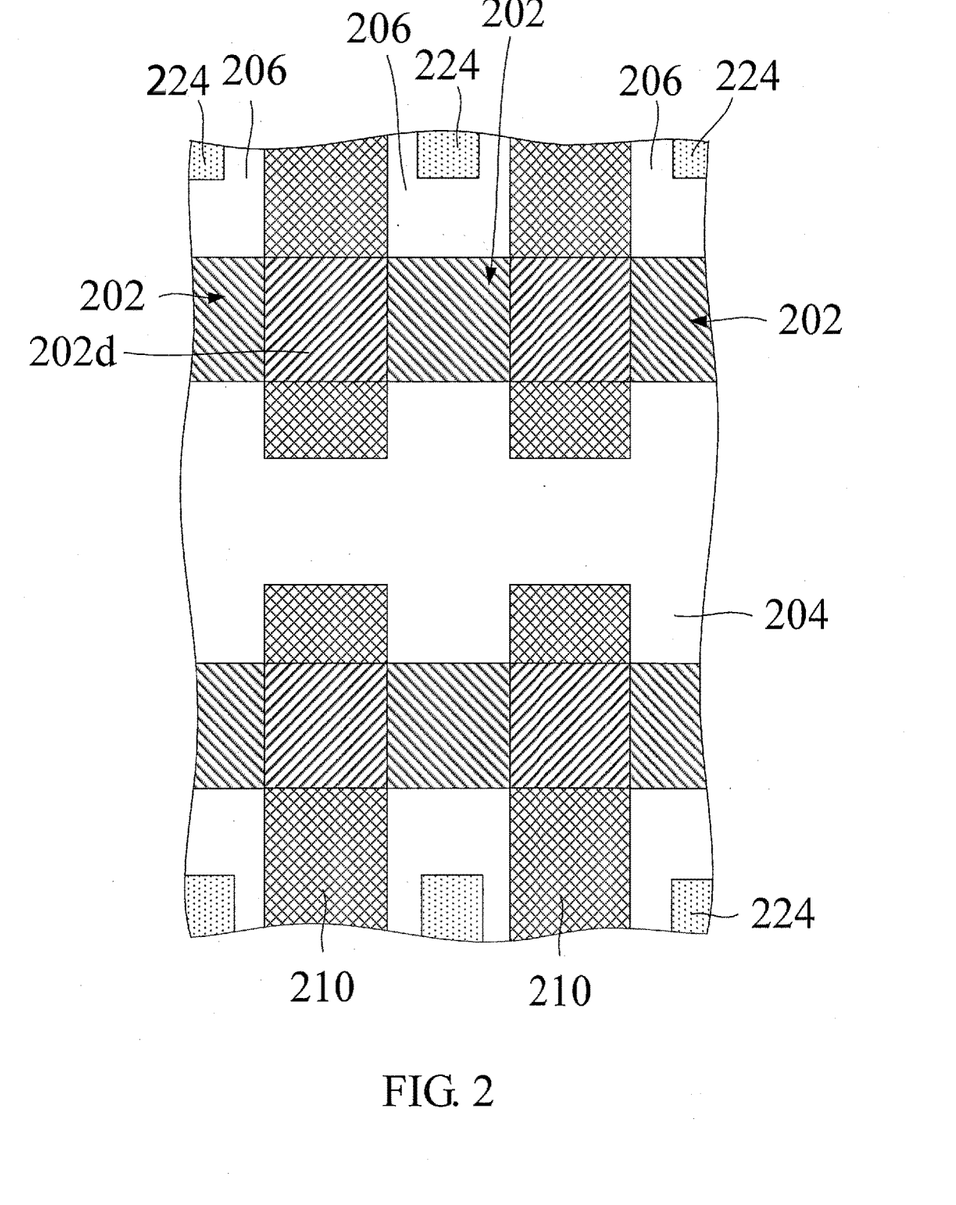
FIG. 2 is a top view of a non-volatile memory having discrete isolation structures and SONOS memory cells according to an embodiment of the present invention.

First, referring to FIG. 2, there is shown a top view of a non-volatile memory having discrete isolation structures and SONOS memory cells according to an embodiment of the present invention. FIG. 2 shows the non-volatile memory array in part. The memory array comprises a plurality of gate structures 202 functioning as SONOS memory cells. The gate structures 202 are connected by the control gates 202d to form word lines arranged transversely. Each said gate structure 202 is adjacent to a drain region 206 and a source region 204 which are parallel to the word lines. Isolation structures 210 of the present invention are discrete. Referring to FIG. 2, the isolation structures 210 are no longer present between the source regions 104 separated according to the prior art. That is to say, during an implantation process of the source regions, source regions thus implanted are continuous, thereby dispensing with the fabrication steps of the source line contact windows and the barrier pins corresponding thereto and streamlining the spatial arrangement within the non-volatile memory.

In an embodiment of the present invention, the source region contact windows configured for external electrical connection and the barrier pins corresponding thereto are provided at intervals for a predetermined number of SONOS memory cells to thereby streamline the spatial arrangement within the non-volatile memory and facilitate the scaling down of memory. For example, only one barrier pin is required for every two or more consecutive SONOS memory cells. In this regard, the required number of the consecutive SONOS memory cells which necessitates a barrier pin is determined by the driving capacity of the whole non-volatile memory, that is, determined as needed.

A bit line contact window 224 is still disposed on the drain region 206. The bit line contact windows 224 are each filled with the barrier pins and connected together above by means of a bit line (not shown), such that the drain regions 206 separated by the isolation structures 210 are connected above to form bit lines.

Referring to FIGS. 3 through 7, there are shown perspective cross-sectional views of a non-volatile memory having discrete isolation structures and SONOS memory cells in different steps of a manufacturing process according to an embodiment of the present invention. The diagrams show the non-volatile memory in part, wherein the constituent elements thereof are not drawn to scale.

Figure 3:
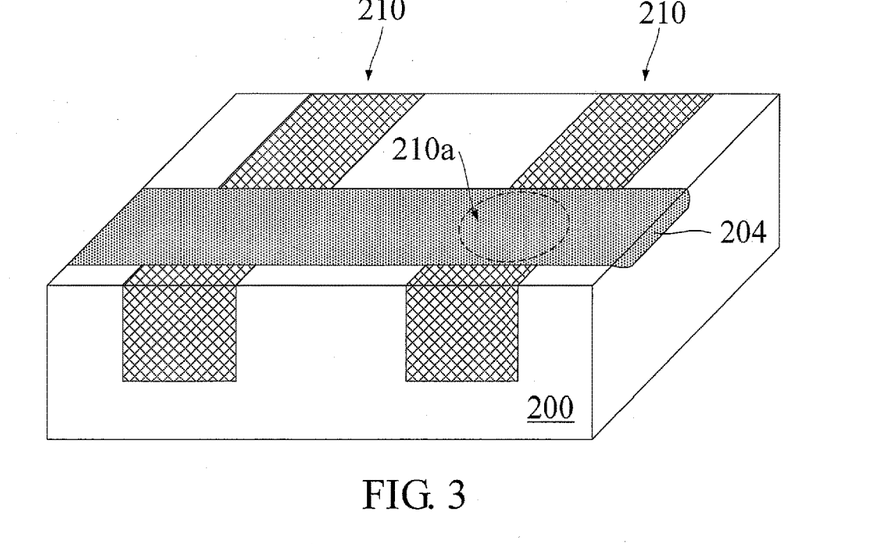
FIGS. 3 through 7 are perspective cross-sectional views of a non-volatile memory having discrete isolation structures and SONOS memory cells in different steps of a manufacturing process according to an embodiment of the present invention.

Referring to FIG. 3, the isolation structures 210, each of which is discrete, are formed in a semiconductor substrate 200 by means of a mask or by any other equivalent means. Each isolation structure 210 is severed by a gap 210a. Channels exposed from the semiconductor substrate 200 are formed in the gaps 210a, respectively, and extended in a direction perpendicular to the isolation structures 210. Afterward, a source ion implantation process is performed, the channels enable ions to be implanted in the semiconductor substrate 200 at the channels, so as to form the source region 204. Upon completion of a subsequent process, the source region 204 is disposed in the semiconductor substrate 200 on one side of the gate structures 202 (see FIG. 7). The semiconductor substrate 200 is made of silicon (Si), silicon germanium (SiGe), silicon-on-insulator (SOI), silicon-germanium-on-insulator (SGOI), or germanium-on-insulator (GOI).

At the beginning of a process, the present invention is characterized in that, due to the special arrangement of discrete isolation structures, the source regions and other well regions are implanted in the semiconductor substrate 200. The implantation of other well regions is a means widely employed by persons skilled in the art and therefore is not reiterated herein for the sake of brevity.

Figure 4:
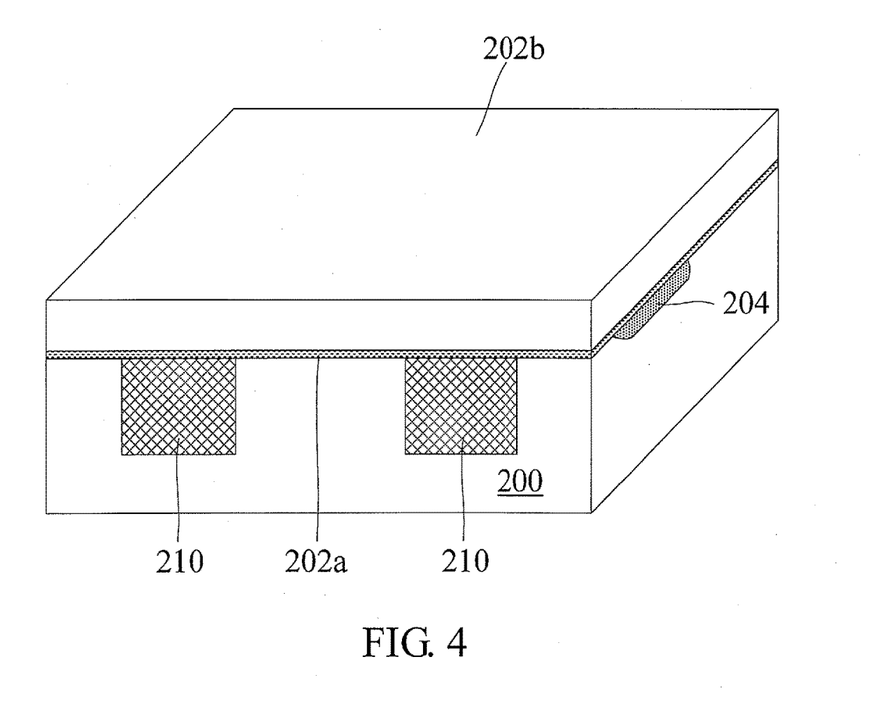
Figure 5:
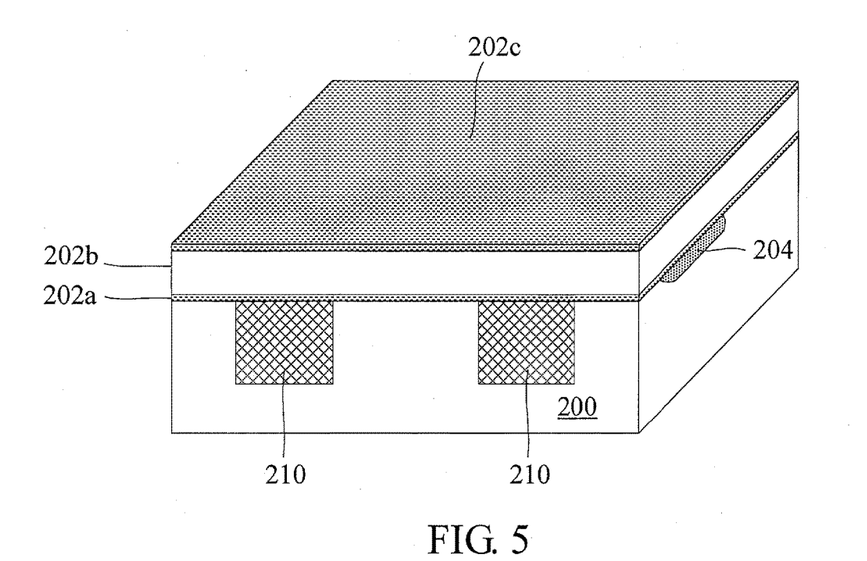

Referring to FIG. 4, for example, a tunnel oxide layer 202a is formed on the semiconductor substrate 200 by thermal oxidation. For example, the tunnel oxide layer 202a is a silicon oxide layer. Then, a silicon nitride layer 202b is deposited on the tunnel oxide layer 202a by Low Pressure Chemical Vapor Deposition (LPCVD). Afterward, for example, a silicon oxide layer 202c (i.e., an oxide coating) is deposited on the silicon nitride layer 202b by thermal oxidation to form an ONO (Oxide-Nitride-Oxide) structure (see FIG. 5).

Figure 6:
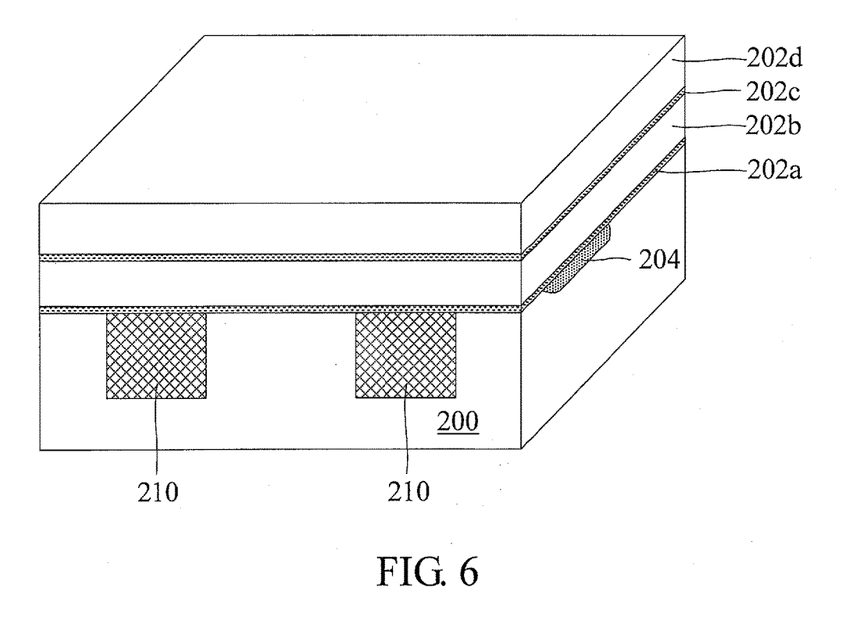
Figure 7:
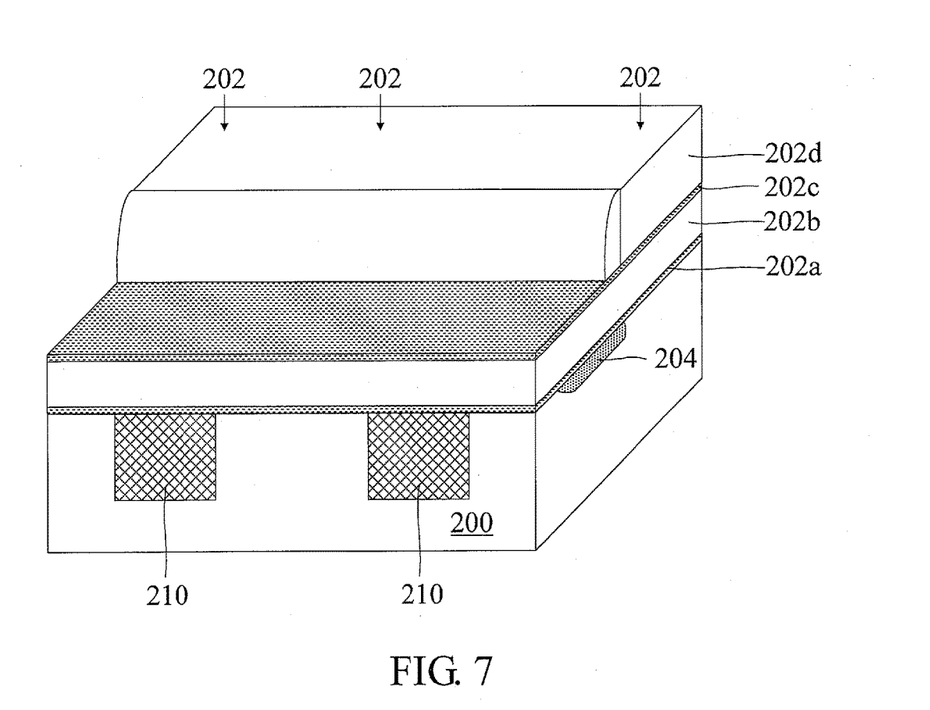

Referring to FIG. 6, then, a controlling gate 202d is formed (for example, depositing polysilicon). The controlling gate 202d is deposited on an ONO structure, so as to form a plurality of gate structures 202 (see FIG. 7) formed by stacking formed by a patterning process, such as photoresist masks and etching. The stacking structures at a position that lacks any said isolation structure 210 become the gate structure 202 (as labeled in FIG. 7), and the transverse gate structures 202 are connected to form word lines WL. Also, as shown in the diagram, the controlling gates 202d on the semiconductor substrate 200 are aligned in a direction perpendicular to the isolation structures 210.

Figure 8:
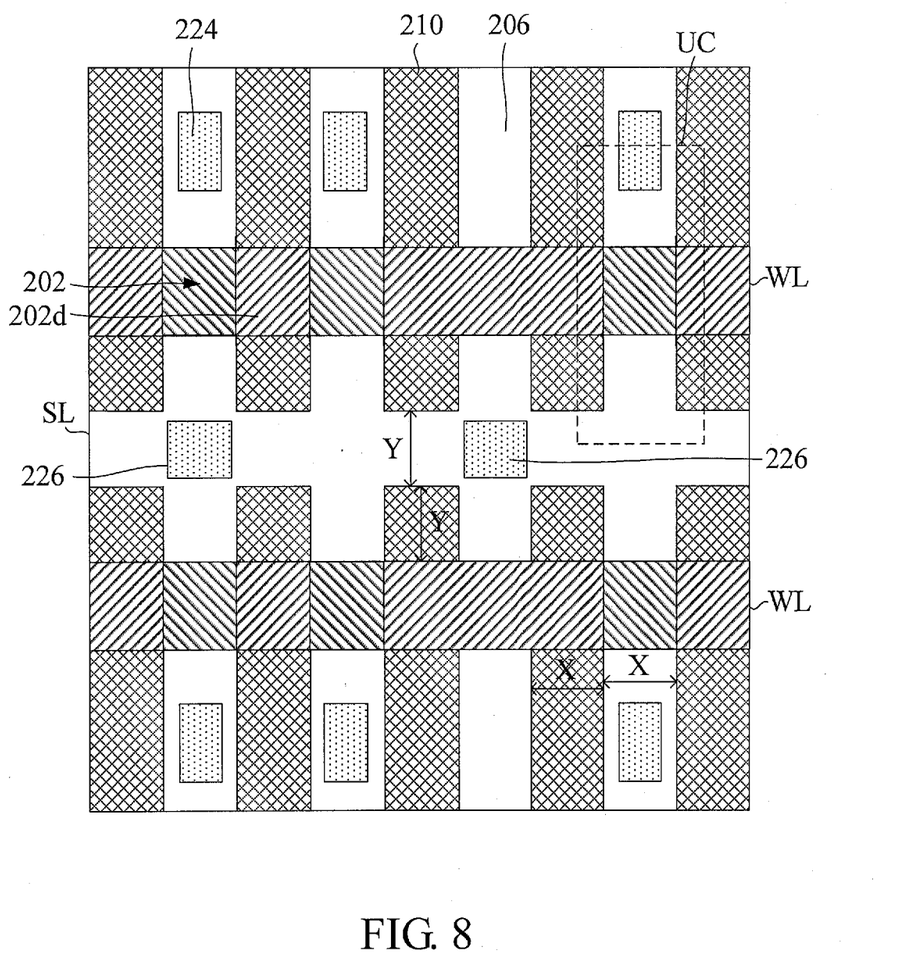
FIG. 8 is the first schematic view of the isolation structures and a source line contact window according to the present invention.

Referring to FIG. 8, there is shown the first schematic view of the isolation structures and a source line contact window according to the present invention. As shown in the diagram, a unit cell is denoted by UC. In the semiconductor substrate, when viewed from a transverse perspective, after crossing two discrete isolation structures 210 consecutively, a source line SL is connected to the source line contact window 226. In a preferred embodiment, after crossing 64 discrete isolation structures 210 consecutively, the source line SL is connected to the source line contact window 226; in other words, the source line SL is connected to a pin (Vss pickup) having a reference voltage level, after the source line SL has crossed 64 bit lines consecutively. Furthermore, the isolation structures 210 and regions located within the semiconductor substrate and between two neighboring isolation structures 210 each have a width X of 0.16 μm when viewed in a direction parallel to word lines WL. Both the width Y of each of the source lines SL in a direction perpendicular to the word lines WL and the distance Y between each of the source lines SL and the neighboring word line WL on the semiconductor substrate equal 0.1 μm.

Figure 9:
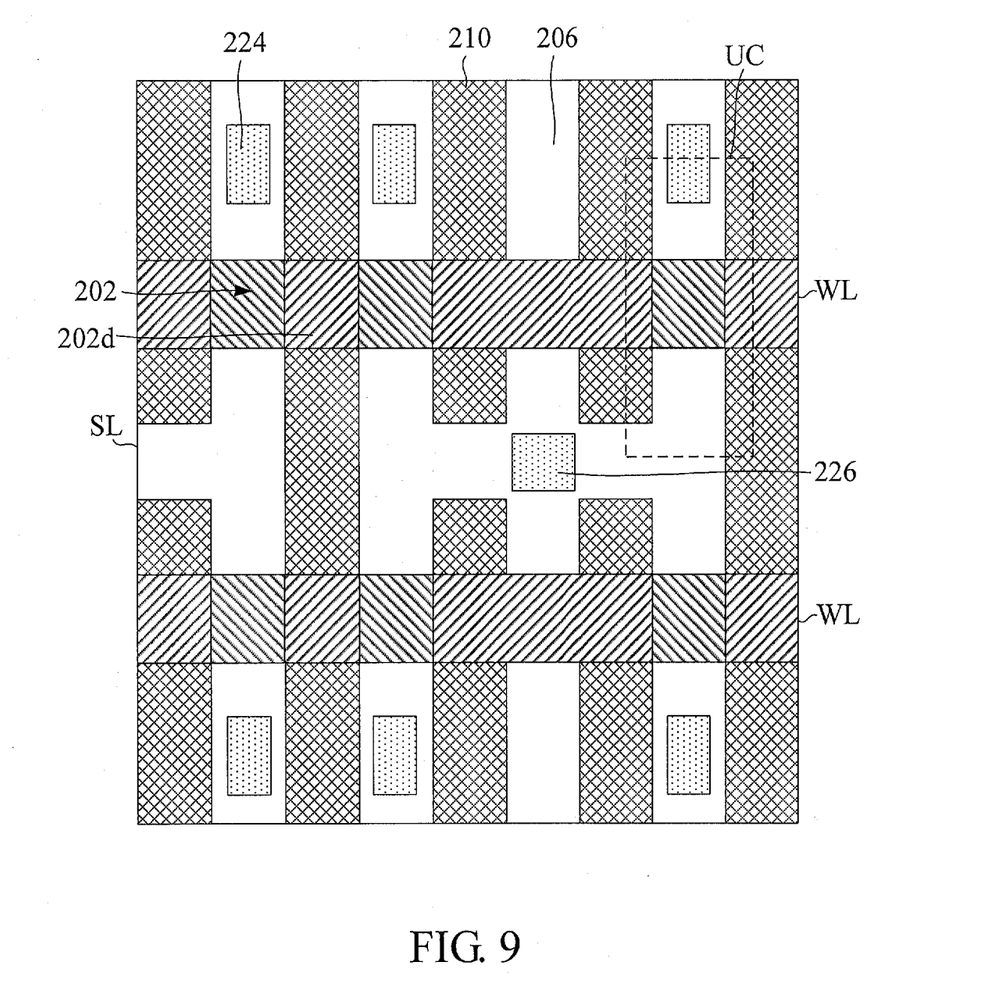
FIG. 9 is the second schematic view of the isolation structures and the source line contact window according to the present invention.

Referring to FIG. 9, there is shown the second schematic view of the isolation structures and the source line contact window according to the present invention. In the semiconductor substrate, one isolation structure 210 which is not severed and therefore is intact alternates with two neighboring discrete isolation structures 210, whereas the source line contact window 226 is positioned at the junction of the source line SL and the drain region 206 lying between two neighboring severed isolation structures 210.

Figure 10:
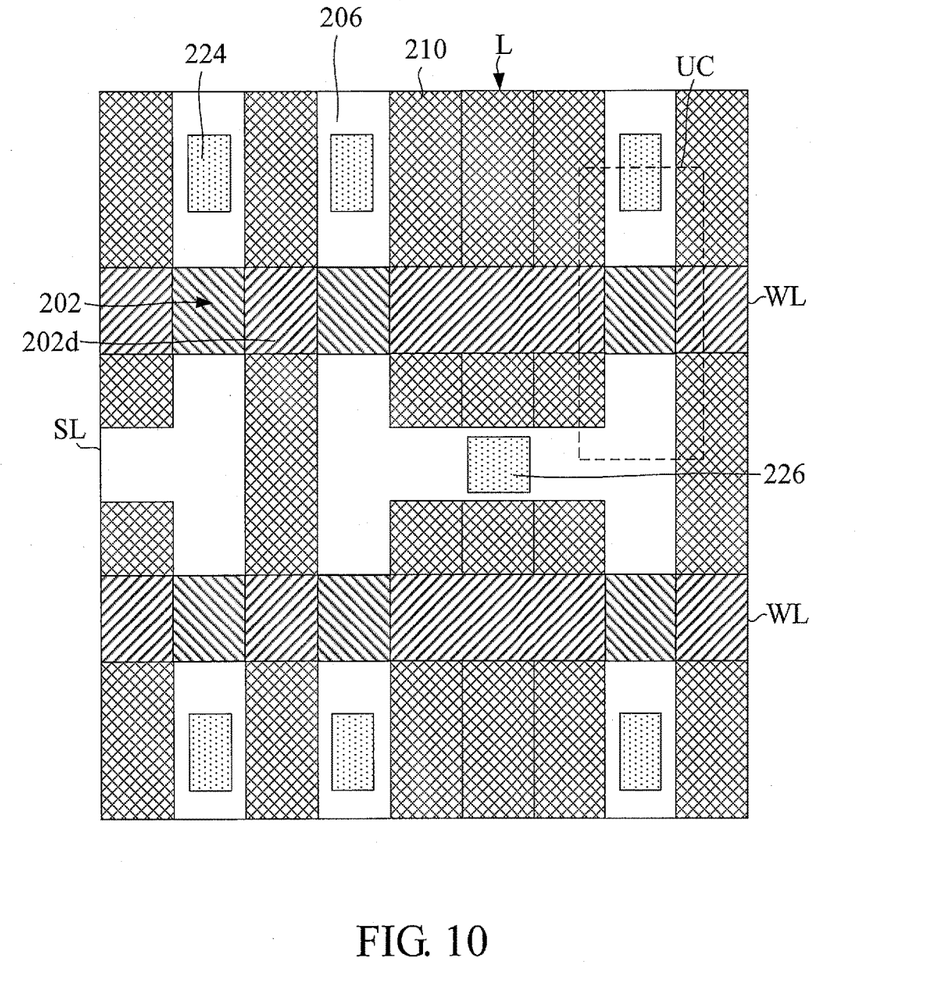
FIG. 10 is the third schematic view of the isolation structures and the source line contact window according to the present invention.

Referring to FIG. 10, there is shown the third schematic view of the isolation structures and the source line contact window according to the present invention. As shown in FIG. 10, the isolation structure 210 denoted by L has the source line contact window 226 and is flanked by two isolation structures 210 parallel thereto. The isolation structure 210 denoted by L and the two flanking isolation structures 210 are discrete and collectively form a large isolation structure region.

A method of operating the non-volatile memory comprises the following steps. A programming step which entails applying a positive voltage to a gate and one of source regions and drain regions of SONOS memory cells to be programmed. An erasing step which entails applying a positive voltage to one of source regions and drain regions of the SONOS memory cells to be erased and applying a negative voltage to a gate of the SONOS memory cells to be erased. A reading step which entails applying a positive voltage to a gate and one of the drain regions and source regions of the SONOS memory cells to be read, wherein the voltage applied in the reading step is lower than the voltage applied in the programming step. Therefore, reading only occurs to the reading step in which a low voltage is applied.

In conclusion, the spatial arrangement within the non-volatile memory of the present invention is streamlined greatly, thereby facilitating memory scaledown. For instance, gate structures beneath two neighboring word lines can be designed to be closer to each other than they are as disclosed in the prior art, not to mention that the prior art requires giving considerations to the space of a source line contact window.

The present invention is disclosed above by preferred embodiments. However, persons skilled in the art should understand that the preferred embodiments are illustrative of the present invention only, but should not be interpreted as restrictive of the scope of the present invention. Hence, all equivalent modifications and replacements made to the aforesaid embodiments should fall within the scope of the present invention. Accordingly, the legal protection for the present invention should be defined by the appended claims.

What is claimed is:

1. A non-volatile memory having a first discrete isolation structure and a second discrete isolation structure and a SONOS (Silicon Oxide Nitride Oxide Silicon) memory cell, the non-volatile memory comprising:
   the first discrete isolation structure and the second isolation structure on a surface of a semiconductor substrate, wherein the first discrete isolation structure and the second discrete isolation structure are arranged parallel to a column direction and spaced apart in a row direction, the column direction being perpendicular to the row direction, the first discrete isolation structure being effectuated by a plurality of first gaps, the plurality of first gaps being distributed on a first column in the column direction to allow the first discrete isolation structure to be completely divided into a plurality of sections, the second discrete isolation structure being effectuated by a plurality of second gaps, the plurality of second gaps being distributed on a second column in the column direction to allow the second discrete isolation structure to be completely divided into a plurality of sections;
   a source region of the SONOS memory cell, wherein the channel is disposed on a first row in the row direction, the channel being in communication with one of the first gaps and being disposed at one of the second gaps, wherein the one of the first gaps and the one of the second gaps are disposed in the first row;
   a plurality of continuous isolation structures in the semiconductor substrate, each continuous isolation structure of the plurality of continuous isolation structures extending continuously in a column direction, such that each continuous isolation structure overlaps, in the row direction, an entirety of each of the plurality of sections of the first and second discrete isolation structures;
   ONO (Oxide-Nitride-Oxide) structures on a surface of the semiconductor substrate;
   a plurality of controlling gates on the ONO structures, wherein the plurality of controlling gates are arranged parallel to the row direction; and
   at least one source line contact windows on the source region of the SONOS memory cell;

wherein, in plan view, the first discreet isolation structure has a same width in the row direction as the second discrete isolation structure;

wherein the second discrete isolation structure is flanked by two adjoining discrete isolation structures parallel to the second discrete isolation structure and the first discrete isolation structure is not flanked by any adjoining discrete isolation structures.

2. The non-volatile memory of claim 1, wherein the first discrete isolation structure and the second discrete isolation structure are shallow trench isolation structures.

3. The non-volatile memory of claim 1, wherein the first discrete isolation structure and the second discrete isolation structure and regions located within the semiconductor substrate and between two neighboring isolation structures each have a width of 0.16 µm when viewed in the row direction.

4. The non-volatile memory of claim 3, wherein both a width of each source line of the at least one source line in the column direction and a distance between each source line of the at least one source line and a neighboring word line on the semiconductor substrate is equal 0.1 µm.

5. The non-volatile memory of claim 1, wherein the at least one source line is made of one of cobalt silicide, nickel silicide, and titanium silicide.

6. A method of operating the non-volatile memory of claim 1, the method comprising the steps of:
 (a programming step): applying a first positive voltage to one of a gate, the source region, and a drain region of the SONOS memory cell to be programmed;
 (an erasing step): applying a second positive voltage to one of the source region and the drain region of the SONOS memory cell to be erased and applying a negative voltage to the gate of the SONOS memory cell to be erased; and
 (a reading step): applying a third positive voltage to one of the gate, the drain region and source region of the SONOS memory cell to be read, wherein the third positive voltage applied in the reading step is lower than the first positive voltage applied in the programming step.

7. A method of manufacturing a non-volatile memory having a first discrete isolation structure and a second discrete isolation structure and a SONOS (Silicon Oxide Nitride Oxide Silicon) memory cell, the method comprising the steps of:
 forming the first discrete isolation structure and the second isolation structure on a surface of a semiconductor substrate, wherein the first discrete isolation structure and the second discrete isolation structure are arranged parallel to a column direction and spaced apart in a row direction, the column direction being perpendicular to the row direction, the first discrete isolation structure being effectuated by a plurality of first gaps, the plurality of first gaps being distributed on a first column in the column direction to allow the first discrete isolation structure to be completely divided into a plurality of sections, the second discrete isolation structure being effectuated by a plurality of second gaps, the plurality of second gaps being distributed on a second column in the column direction to allow the second discrete isolation structure to be completely divided into a plurality of sections;

performing a source ion implantation process in a channel to form a source region of the SONOS memory cell, wherein the channel is disposed on a first row in the row direction, the channel being in communication with one of the first gaps and being disposed at one of the second gaps, wherein the one of the first gaps and the one of the second gaps are disposed in the first row;

forming a plurality of continuous isolation structures in the semiconductor substrate, each continuous isolation structure of the plurality of continuous isolation structures extending continuously in a column direction, such that each continuous isolation structure overlaps, in the row direction, an entirety of each of the plurality of sections of the first and second discrete isolation structures;

forming ONO (Oxide-Nitride-Oxide) structures on a surface of the semiconductor substrate after the source region of the SONOS memory cell is formed;

depositing and patterning a plurality of controlling gates on the ONO structures, wherein the plurality of controlling gates are arranged parallel to the row direction; and forming at least one source line contact windows on the source region of the SONOS memory cell;

wherein, in plan view, the first discreet isolation structure has a same width in the row direction as the second discrete isolation structure;

wherein the second discrete isolation structure is flanked by two adjoining discrete isolation structures parallel to the second discrete isolation structure and the first discrete isolation structure is not flanked by any adjoining discrete isolation structures.

* * * * *